(12) United States Patent
Jang et al.

(10) Patent No.: US 11,121,202 B2
(45) Date of Patent: Sep. 14, 2021

(54) DISPLAY APPARATUS

(71) Applicant: Samsung Display Co., Ltd., Yongin-si (KR)

(72) Inventors: Minjun Jang, Yongin-si (KR); Sunghoon Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 16 days.

(21) Appl. No.: 16/502,516

(22) Filed: Jul. 3, 2019

(65) Prior Publication Data
US 2020/0013845 A1    Jan. 9, 2020

(30) Foreign Application Priority Data
Jul. 3, 2018   (KR) .................. 10-2018-0077320

(51) Int. Cl.
*H01L 29/08*    (2006.01)
*H01L 35/24*    (2006.01)
*H01L 51/00*    (2006.01)
*H01L 27/32*    (2006.01)
*H01L 51/52*    (2006.01)

(52) U.S. Cl.
CPC ...... *H01L 27/3276* (2013.01); *H01L 51/5237* (2013.01)

(58) Field of Classification Search
CPC ............ H01L 27/3276; H01L 51/5237; H01L 51/0097; H01L 23/4824; H01L 23/481; H01L 2224/02372; H01L 2224/02381; H01L 2224/02331; H01L 2224/02333; Y02E 10/549
See application file for complete search history.

(56) References Cited

U.S. PATENT DOCUMENTS

| | | | |
|---|---|---|---|
| 9,591,754 B2 | 3/2017 | Lee | |
| 9,761,560 B2 | 9/2017 | Lee et al. | |
| 9,947,692 B2 | 4/2018 | Lee et al. | |
| 2015/0070616 A1* | 3/2015 | Ogasawara | ........... G02F 1/1368 349/43 |
| 2016/0270234 A1 | 9/2016 | Ahn | |
| 2017/0048990 A1 | 2/2017 | Sim et al. | |

(Continued)

FOREIGN PATENT DOCUMENTS

| | | |
|---|---|---|
| KR | 10-1373519 | 7/2008 |
| KR | 10-2015-0144907 | 12/2015 |

(Continued)

*Primary Examiner* — Ismail A Muse

(74) *Attorney, Agent, or Firm* — H.C. Park & Associates, PLC

(57) ABSTRACT

A display apparatus includes a substrate on which a first indented portion indented inward along one side of the substrate is formed; a first pad unit and a second pad unit spaced apart from each other on the substrate along the one side; a display unit above the substrate and having a shape indented inward between the first pad unit and the second pad unit; an encapsulating unit encapsulating the display unit; and a wiring film bent from a first surface of the substrate to a second surface of the substrate, the wiring film including a third pad unit and a fourth pad unit connected to the first pad unit and the second pad unit, respectively, and a second indented portion indented inward between the third pad unit and the fourth pad unit.

22 Claims, 15 Drawing Sheets

(56) References Cited

U.S. PATENT DOCUMENTS

2017/0352311 A1    12/2017  Lee et al.
2017/0371376 A1    12/2017  Chung et al.
2018/0307084 A1*   10/2018  Lee .................. G02F 1/133308
2019/0294281 A1*    9/2019  Kim .................. H01L 27/3276

FOREIGN PATENT DOCUMENTS

| KR | 10-2016-0043571 | 4/2016 |
| KR | 10-2016-0110861 | 9/2016 |
| KR | 10-2017-0018693 | 2/2017 |
| KR | 10-2017-0032523 | 3/2017 |
| KR | 10-2017-0136683 | 12/2017 |
| KR | 10-2018-0002108 | 1/2018 |

* cited by examiner

BEFORE APPLICATION
OF PRESSURE

AFTER APPLICATION
OF PRESSURE

DISPLAY APPARATUS

CROSS-REFERENCE TO RELATED APPLICATION

This application claims priority from and the benefit of Korean Patent Application No. 10-2018-0077320, filed on Jul. 3, 2018, which is hereby incorporated by reference for all purposes as if fully set forth herein.

BACKGROUND

Field

Exemplary embodiments of the invention relate generally to a display apparatus, and more specifically, to a display apparatus including a display unit of indented shape.

Discussion of the Background

There has been an increasing demand for a large screen for a portable display apparatus including a display unit such as a mobile phone, a tablet PC, and a game console.

Meanwhile, in order to meet various consumer demands, various components for expanding and supporting functions of a portable display apparatus such as a camera module, a speaker, and a sensor need be mounted on the portable display apparatus.

The above information disclosed in this Background section is only for understanding of the background of the inventive concepts, and, therefore, it may contain information that does not constitute prior art.

SUMMARY

It is not easy to implement a large number of components and at the same time to meet the needs of a large screen.

Devices constructed according to exemplary embodiments of the invention capable of realizing a large screen while also mounting various components.

Additional features of the inventive concepts will be set forth in the description which follows, and in part will be apparent from the description, or may be learned by practice of the inventive concepts.

According to one or more exemplary embodiments, a display apparatus includes a substrate on which a first indented portion indented inward along one side of the substrate is formed; a first pad unit and a second pad unit spaced apart from each other on the substrate along the one side; a display unit above the substrate and having a shape indented inward between the first pad unit and the second pad unit; an encapsulating unit encapsulating the display unit; and a wiring film bent from a first surface of the substrate to a second surface of the substrate, the wiring film including a third pad unit and a fourth pad unit connected to the first pad unit and the second pad unit, respectively, and a second indented portion indented inward between the third pad unit and the fourth pad unit.

The encapsulating unit may include at least one inorganic layer and at least one organic layer.

The encapsulating unit may include at least one inorganic layer and at least one organic layer, an outermost layer of the encapsulating unit may include an inorganic layer, and the inorganic layer, which is included in the outermost layer, may cover a side surface of the at least one organic layer.

The encapsulating unit may include at least one inorganic layer and at least one organic layer, an outermost layer of the encapsulating unit may include an inorganic layer, and the inorganic layer, which is included in the outermost layer, may cover a side surface of a substrate in which the first indented portion is formed.

A test dummy pixel may be further arranged outside the display unit along the first indented portion.

The wiring film may further include an integrated circuit chip, wherein the integrated circuit chip may be arranged so as not to overlap the display unit.

The wiring film may further include a ground portion grounded to the wiring film along the second indented portion.

A transparent substrate may be further arranged above the encapsulating unit.

A black matrix may be further arranged above the transparent substrate at a position corresponding to an outer edge of the display unit.

The black matrix may have a first opening at a position corresponding to the first indented portion.

The transparent substrate may have a second opening at a position corresponding to the first opening.

The display apparatus may further include a polarizer film between the encapsulating unit and the transparent substrate.

The display apparatus may further include an adhesive layer between the polarizer film and the transparent substrate.

The display apparatus may further include a filler between the substrate and the transparent substrate, the filler being spaced apart from the adhesive layer and surrounding an outer edge of the display unit.

The display apparatus may further include a cover panel on the second surface of the substrate and including a cushioning material.

An end of the cover panel may coincide with an end of the substrate in the first indented portion.

An end of the cover panel may protrude from an end of the substrate to an outside of the display unit in the first indented portion.

The first pad unit and the second pad unit may include a plurality of pad wirings, wherein the plurality of pad wirings may be formed obliquely so as to be symmetrical to a center of the first indented portion.

The third pad unit and the fourth pad unit may include a plurality of pad wirings, wherein the plurality of pad wirings may be formed obliquely so as to be symmetrical to a center of the second indented portion.

A maximum depth from an edge of an area where the wiring film is bent to the second indented portion may be not less than a maximum depth from an edge of the area where the wiring film is bent to the first indented portion.

A maximum depth from an end of the third pad unit and the fourth pad unit of the wiring film to the second indented portion may be not less than a maximum depth from an end of the substrate to the first indented portion.

According to one or more exemplary embodiments, a display apparatus includes: a substrate on which a first indented portion indented inward along one side of the substrate is formed; a first pad unit and a second pad unit spaced apart from each other on the substrate along the one side; a display unit above the substrate and having a shape indented inward between the first pad unit and the second pad unit; an encapsulating unit encapsulating the display unit; and a wiring film bent from a first surface of the substrate to a second surface of the substrate, the wiring film including a third pad unit and a fourth pad unit connected to the first pad unit and the second pad unit, respectively, a dummy pad unit connecting the third pad unit and the fourth pad unit, and a through hole formed inward along the one side of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
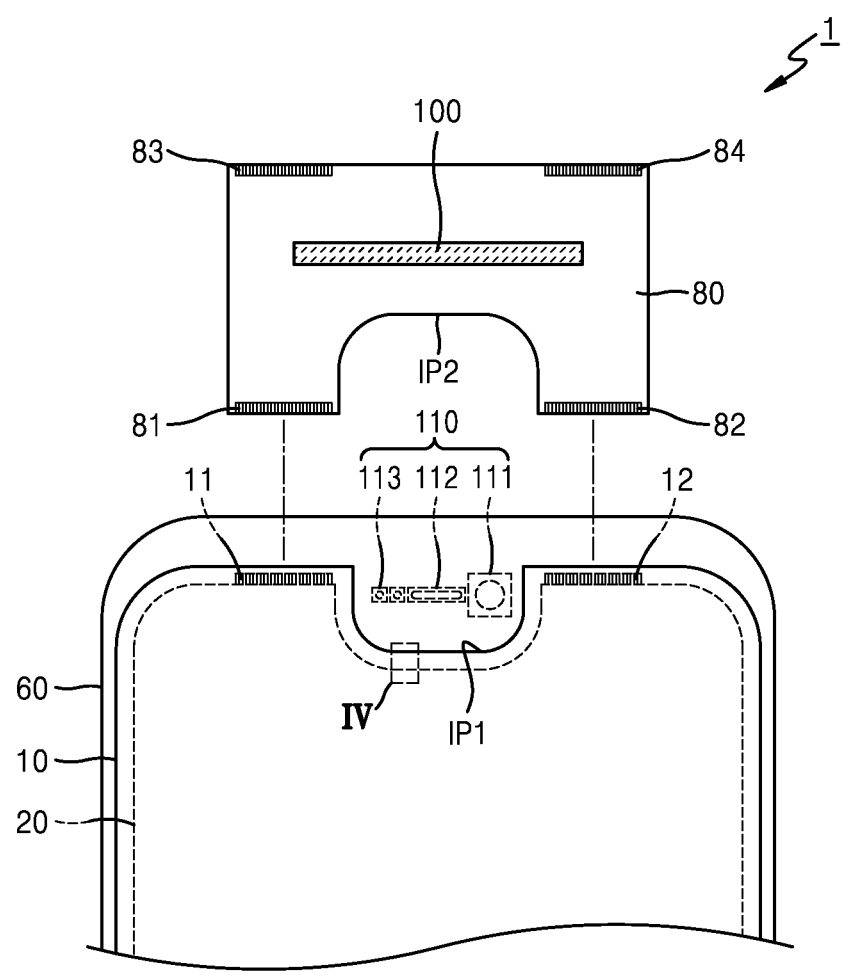
FIGS. 1A, 1B, and 1C are plan views of a connection process of a substrate and a wiring film in a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute or property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer, is referred to as being "on", "connected to", or "coupled to" another element or layer, it may be directly on, connected to, or coupled to the another element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as XYZ, XYY, YZ, and ZZ. As used herein, the term "and/or" includes any and all combinations of one or more of the associated listed items.

Although the terms "first" and "second", etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including", when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially", "about", and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements or wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
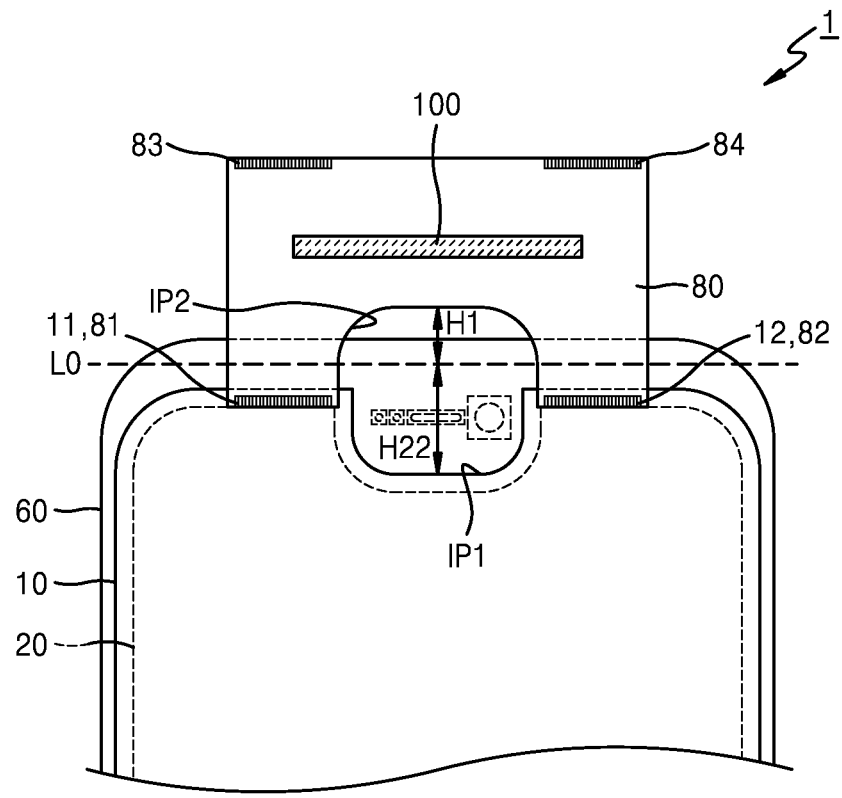
Figure 1C:
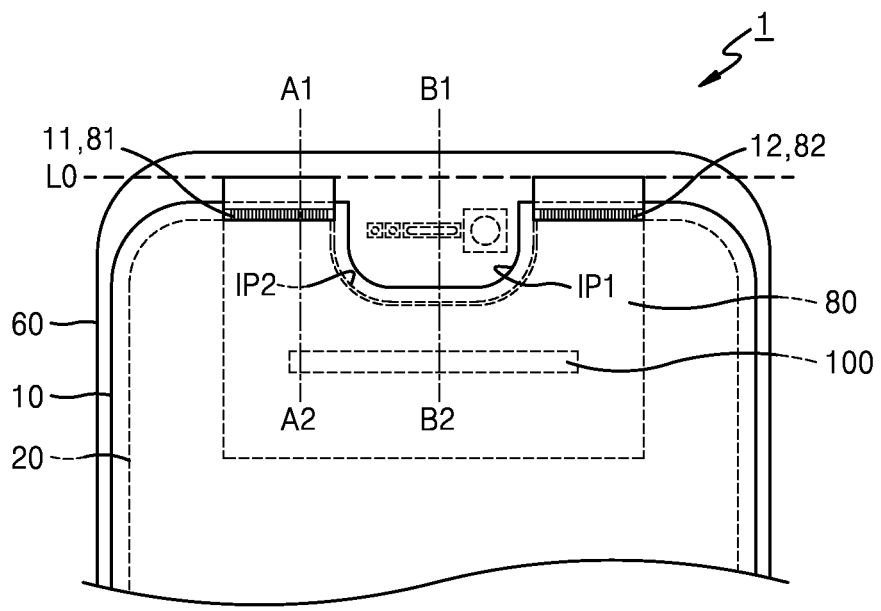
Figure 2:
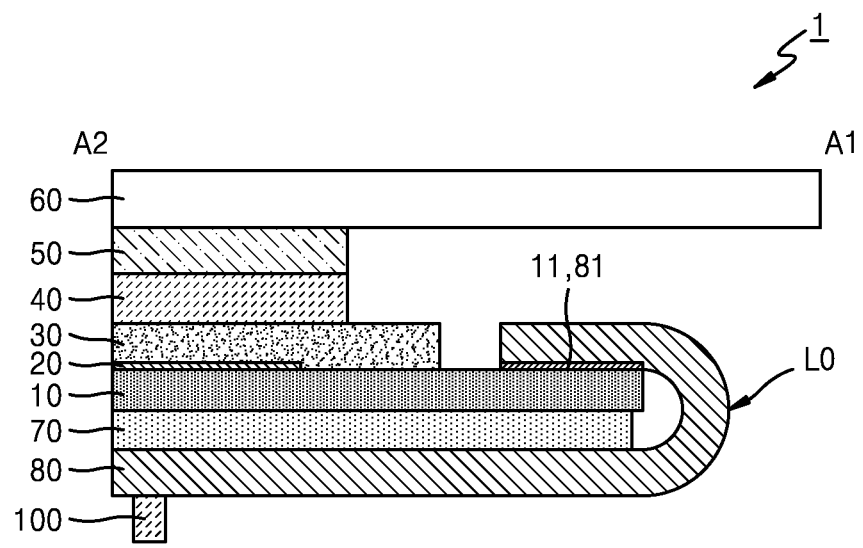
FIG. 2 is a cross-sectional view of a portion of a display apparatus taken along a line A1-A2 of FIG. 1C.
Figure 3:
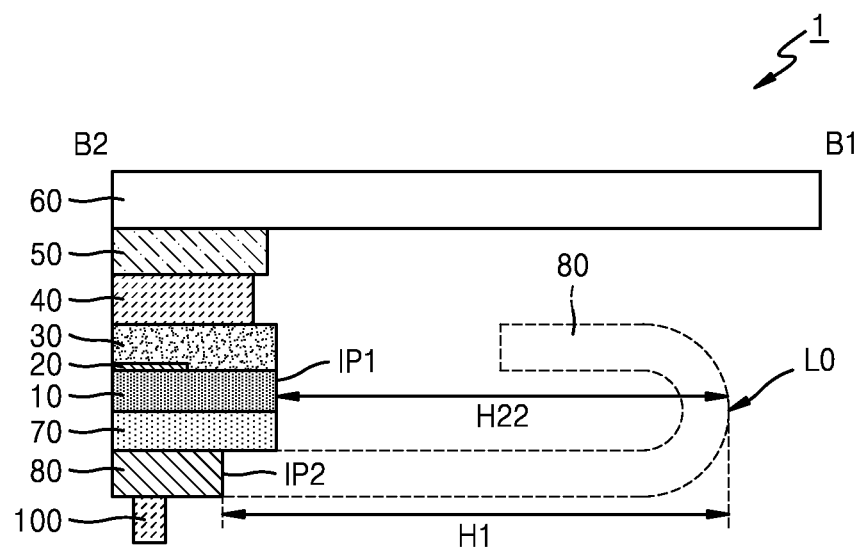
FIG. 3 is a cross-sectional view of a portion of a display apparatus taken along a line B1-B2 of FIG. 1C.
Figure 4:
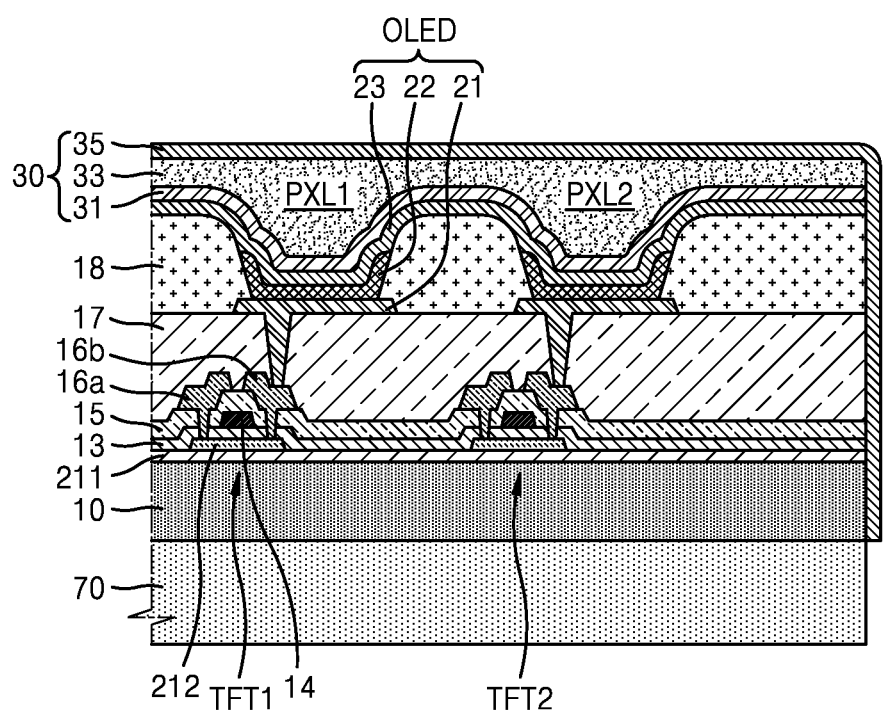
FIG. 4 is a cross-sectional view of portion IV of FIG. 1A.

FIGS. 1A, 1B, and 1C are plan views of a connection process of a substrate 10 and a wiring film 80 in a display apparatus according to an exemplary embodiment, FIG. 2 is a cross-sectional view of a portion of a display apparatus taken along a line A1-A2 of FIG. 1C, FIG. 3 is a cross-sectional view of a portion of a display apparatus taken along a line B1-B2 of FIG. 1C, and FIG. 4 is a cross-sectional view of portion IV of FIG. 1A.

Referring to FIGS. 1A to 4, a display apparatus 1 according to an exemplary embodiment includes the substrate 10 on which a first indented portion IP1 indented inward along one side of the substrate 10 is formed, a first pad unit 11 and a second pad unit 12 spaced apart from each other on the substrate 10 along the one side, a display unit 20 over the substrate 10 and having a shape indented inward between the first pad unit 11 and the second pad unit 12, an encapsulating unit 30 for encapsulating the display unit 20, a third pad unit 81 and a fourth pad unit 82 connected to the first pad unit 11 and the second pad unit 12, respectively, a second indented portion IP2 indented inward between the third pad unit 81 and the fourth pad unit 82, and the wiring film 80 bent from one surface of the substrate 10 to the other surface of the substrate 10.

The substrate 10 may be formed of various materials such as a glass material, a metal material or a plastic material, or the like. For example, the substrate 10 may be a flexible substrate including a polymer resin such as polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

The substrate 10 has the first indented portion IP1 formed so as to be indented into the substrate 10 at one side of the substrate 10. The first indented portion IP1 may be one obtained by cutting the substrate 10 using, for example, a cutting method using a laser beam.

Various components 110 capable of expanding functions of the display apparatus 1 such as a camera module 111, a speaker 112, and a sensor 113 may be arranged in a space where the substrate 10 is cut. The sensor 113 may include various sensors necessary for expanding functions of a portable display apparatus such as a proximity sensor, an illuminance sensor, an acceleration sensor, and a biosensor.

On the substrate 10, the first pad unit 11 and the second pad unit 12 are spaced apart from each other along one side of the substrate 10. The first pad unit 11 and the second pad unit 12 are on both sides of a region where the first indented portion IP1 is formed.

The first pad unit 11 and the second pad unit 12 include a plurality of wirings including conductive materials. The first pad unit 11 and the second pad unit 12 may transmit signals to the display unit 20 by being connected to various wirings (not shown), for example, scan wirings, data wirings or power wirings or the like, connected to a plurality of pixels (not shown) in the display unit 20.

The display unit 20 may include a plurality of pixels (not shown) capable of displaying an image. Each pixel may include various display devices such as an organic light-emitting device, a liquid crystal device, an electrophoresis device or a micro inorganic light-emitting device, and the like. The present exemplary embodiment discloses a display apparatus including an organic light-emitting device OLED (of FIG. 4) as an example.

In the present exemplary embodiment, the display unit 20 has a display screen of a shape in which one side is indented rather than a rectangular display screen in which four sides are formed in a substantially straight line. The first indented portion IP1 is formed so as to maintain a predetermined spacing from an edge of the display unit 20.

An encapsulating unit 30 is over the display unit 20. The encapsulating unit 30 is formed to be wider than the display unit 20 so as to cover the edge of the display unit 20 to reduce or prevent impurities from penetrating into the display unit 20 from the outside of the display apparatus 1.

In FIG. 1A, the first pad unit 11 and the second pad unit 12 of the substrate 10 and the third pad unit 81 and the fourth pad unit 82 of the wiring film 80 are aligned so as to correspond to each other, and in FIG. 1C, the wiring film 80 is bent from one surface of the substrate 10 to the other surface of the substrate 10.

The wiring film 80 may include a flexible resin such as a polyimide resin or an epoxy resin, or the like to facilitate bending. The third pad unit 81 and the fourth pad unit 82 of the wiring film 80 include a plurality of wirings including conductive materials.

A conductive bonding layer (not shown) such as an anisotropic conductive film is between the first pad unit 11 of the substrate 10 and the third pad unit 81 of the wiring film 80 and between the second pad unit 12 of the substrate 10 and the fourth pad unit 82 of the wiring film 80, wherein the substrate 10 and the wiring film 80 are physically and firmly bonded and electrically connected to each other by pressing.

In the present exemplary embodiment, the wiring film 80 includes the second indented portion IP2 indented into the wiring film 80 between the third pad unit 81 and the fourth pad unit 82.

The second indented portion IP2 of the wiring film 80 is formed so as not to interfere with a space in which the components 110 may be arranged when the wiring film 80 is bent after being connected to the substrate 10. For example, referring to FIGS. 1B and 3, a maximum depth H1 from an edge L0 of a bent region of the wiring film 80 to the second indented portion IP2 may be formed to be not less than a maximum depth H22 from the edge L0 of the bent region of the wiring film 80 to the first indented portion IP1 formed in the substrate 10.

An integrated circuit chip 100 is mounted in the wiring film 80. Since the integrated circuit chip 100 is further rear than the second indented portion IP2, the integrated circuit chip 100 is in an area overlapping the display unit 20 even when bent and does not interfere with the space in which the components 110 may be arranged.

The integrated circuit chip 100 may include at least one of a scan driving circuit chip, a data driving circuit chip, and a power driving circuit chip.

A plurality of wirings (not shown) are between the integrated circuit chip 100 and the third pad unit 81 and the fourth pad unit 82 so that signals of the integrated circuit chip 100 are supplied to the display unit 20 through the first pad unit 11 and the second pad unit 12.

A cover panel 70 for supporting the substrate 10 is between the substrate 10 and the wiring film 80. The wiring film 80 is bent to a back surface of the cover panel 70 on a back surface of the substrate 10.

The cover panel 70 may include a cushion tape layer (not shown) for absorbing impact on the back surface of the substrate 10 and a black tape layer (not shown) for preventing light leakage from the back surface of the substrate 10.

Although the present exemplary embodiment of FIG. 3 shows that an end of the cover panel 70 coincides with an end of the substrate 10 at the first indented portion IP1, the inventive concepts are not limited thereto. The end of the cover panel 70 may be further indented inward than the end of the substrate 10 or may further protrude outward than the end of the substrate 10 at the first indented portion IP1. This will be described later below.

When the end of the cover panel 70 coincides with the end of the substrate 10 at the first indented portion IP1 in the present exemplary embodiment, it is possible to maximize the space in which the components 110 may be arranged while stably supporting the substrate 10.

The wiring film 80 may further include a fifth pad unit 83 and a sixth pad unit 84 on one side opposite the third pad unit 81 and the fourth pad unit 82.

The fifth pad unit 83 and the sixth pad unit 84 may be connected to a flexible printed circuit board (not shown). The wiring film 80 is formed of a material that is more flexible than the flexible printed circuit board (not shown) and may be made thinner than the flexible printed circuit board to reduce bending stress.

FIG. 4 is a cross-sectional view of a structure of the substrate 10, the display unit 20, the encapsulating unit 30, and the cover panel 70 around the first indented portion IP1.

Disclosed is an exemplary embodiment in which the display unit 20 includes the organic light-emitting device OLED and the encapsulating unit 30 includes a first inorganic layer 31, a first organic layer 33, and a second inorganic layer 35.

A first thin-film transistor TFT1 including a semiconductor layer 212, a gate electrode 14, a source electrode 16a, and a drain electrode 16b is on the substrate 10.

A buffer layer 211 is formed between the substrate 10 and the semiconductor layer 212 and a gate insulating layer 13 is formed between the semiconductor layer 212 and the gate electrode 14. An interlayer insulating layer 15 is between the gate electrode 14 and the source and drain electrodes 16a and 16b and a planarization layer 17 covers the source and drain electrodes 16a and 16b.

The buffer layer 211, the gate insulating layer 13, and the interlayer insulating layer 15 may include an inorganic material such as silicon oxide, silicon nitride and/or silicon oxynitride. The planarization layer 17 may include an inorganic layer and/or an organic layer.

A structure of the first thin-film transistor TFT1 and a structure and materials of an insulating layer shown in FIG. 4 are an example to which the inventive concepts are applied, and the inventive concepts are not limited thereto.

The first thin-film transistor TFT1 serves as a driving transistor and is connected to a pixel electrode 21 to transmit a driving signal to the pixel electrode 21. An end of the pixel electrode 21 is surrounded by a pixel defining layer 18 including an organic insulating layer. The pixel defining layer 18 reduces or prevents an arc from occurring at the end of the pixel electrode 21.

A second thin-film transistor TFT2 may be used as a transistor for testing the performance of a device rather than as a driving transistor, and a structure of the second thin-film transistor TFT2 may be the same as that of the first thin-film transistor TFT1.

An intermediate layer (not shown) including an organic emission layer 22 is above the pixel electrode 21. The organic emission layer 22 may include a low-molecular organic light-emitting material or a high-molecular organic light-emitting material. When the organic emission layer 22 includes the low-molecular organic light-emitting material, the intermediate layer (not shown) may further include a hole injection layer (HIL), a hole transport layer (HTL), an electron transport layer (ETL), and an electron injection layer (EIL). When the organic emission layer 22 includes the high-molecular organic light-emitting material, the intermediate layer (not shown) may further include an HTL.

An opposite electrode 23 formed in common to a plurality of pixels PXL1 and PXL2 is on the organic emission layer 22.

The organic light-emitting device OLED, which is a self-luminous display apparatus in which excitons generated by combining holes injected from a hole injection electrode and electrons injected from an electron injection electrode in an organic light-emitting layer generate light while falling from an excited state to a ground state, may include the pixel electrode 21, the organic emission layer 22, and the opposite electrode 23 and may be formed in a lightweight and thin shape, and thus, an application range of the organic light-emitting device OLED is expanded to a portable display apparatus In FIG. 4, the first pixel PXL1 close to an inside of the display unit 20 is an area for implementing an image of the display apparatus 1 by emitting light with the above-described operating principle. However, the second pixel PXL2 closest to the first indented portion IP1 at an edge of the substrate 10 is a dummy pixel which does not implement an image.

The second thin-film transistor TFT2 may be connected to the second pixel PXL2. The dummy pixel may be used to reduce defects of the display apparatus 1 as a pixel to be used for a signal test or an aging test.

Since the second pixel PXL2 may be damaged in a process of cutting the first indented portion IP1, the second pixel PXL2 may be used as a space used for testing instead of being used as a pixel for displaying an image.

The encapsulating unit 30 for encapsulating the display unit 20 may include a plurality of thin-film layers. For example, in the present exemplary embodiment, the encapsulating unit 30 may have a structure in which the first inorganic layer 31, the first organic layer 33, and the second inorganic layer 35 are sequentially stacked. However, the encapsulating unit 30 is not limited to the above three layers and may be implemented in various embodiments including at least one inorganic layer and at least one organic layer.

The first inorganic layer 31 and the second inorganic layer 35 may include silicon oxide, silicon nitride, and/or silicon oxynitride. The first organic layer 33 may include at least one selected from a group consisting of PET, PEN, PC, PI, PES, polyoxymethylene (POM), PAR, and polyacrylate hexamethyldisiloxane (HMDSO).

The first inorganic layer 31 is curved along a lower structure thereof, so that the surface of the first inorganic layer 31 is not flat. The first organic layer 33 may cover the first inorganic layer 31 which is not flat, thereby making an upper surface of the encapsulating unit 30 flat. The second inorganic layer 35 covers the first organic layer 33.

In this manner, since the encapsulating unit 30 has a multilayer structure including the first inorganic layer 31, the first organic layer 33, and the second inorganic layer 35, even if a crack occurs in the encapsulating unit 30 due to the multilayer structure, the crack may not be connected to a crack between the first inorganic layer 31 and the first organic layer 33, or a crack between the first organic layer 33 and the second inorganic layer 35. Thus, it is possible to prevent or reduce the formation of a path through which impurities such as external moisture and oxygen may penetrate into the display unit 20.

Meanwhile, an outermost layer of the encapsulating unit 30 may include an inorganic layer to reduce or prevent external moisture permeation. For example, an end of the first organic layer 33 may be covered with the second inorganic layer 35. FIG. 4 shows an example in which the second inorganic layer 35 covers a side surface of the substrate 10 at the first indented portion IP1.

Therefore, according to the present exemplary embodiment described above, the second pixel PXL2 is arranged in the display unit 20 near the first indented portion IP1 so that a pixel for displaying an image is not directly exposed to a cut surface. Further, the encapsulating unit 30 is formed by thin-film encapsulation including both an inorganic layer and an organic layer, an outermost thin-film of the encapsulating unit 30 is used as the inorganic layer, and an outermost inorganic layer of the encapsulating unit 30 covers an end of the organic layer. Thus, it is possible to prevent the end of the organic layer from being directly exposed to the outside in a cutting process, thereby reducing or preventing lateral moisture permeation.

Figure 5A:
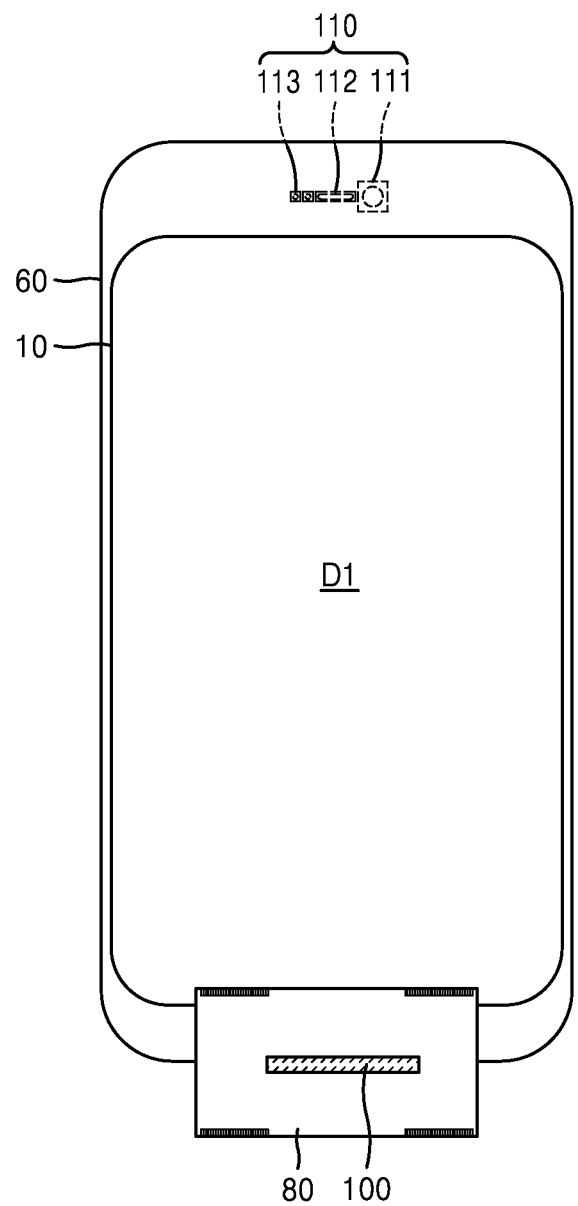
FIGS. 5A, 5B, and 5C are plan views of comparing a display area of a display apparatus according to the inventive concepts with a display area of a display apparatus according to a comparative example.
Figure 5B:
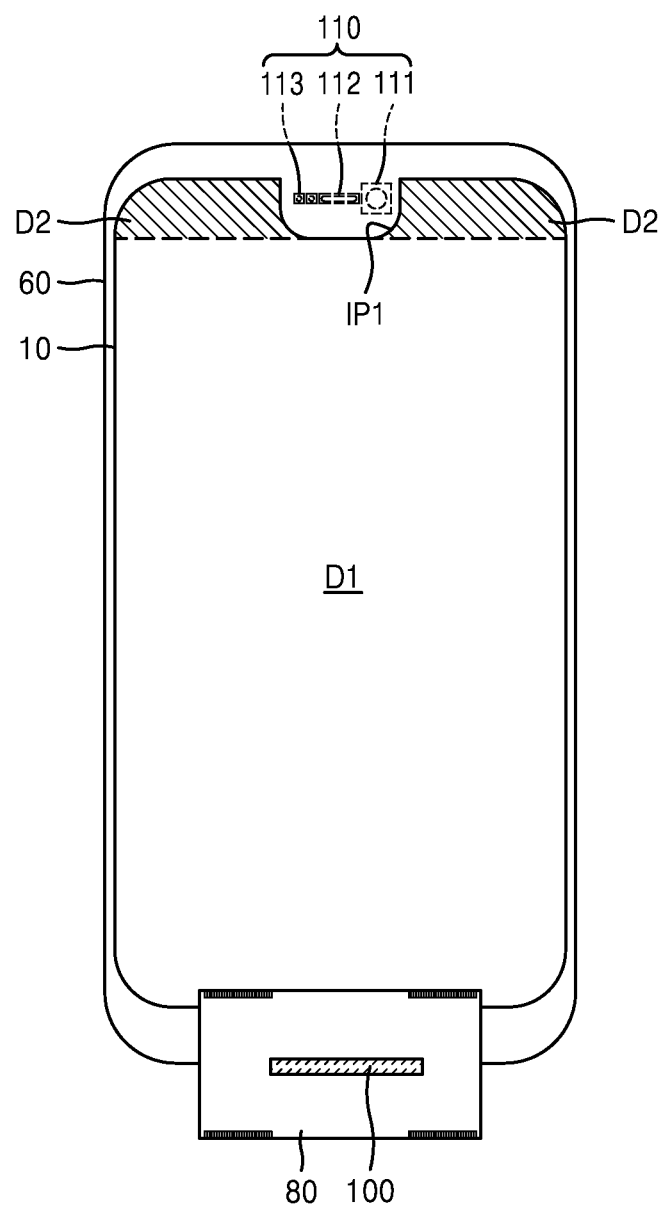
Figure 5C:
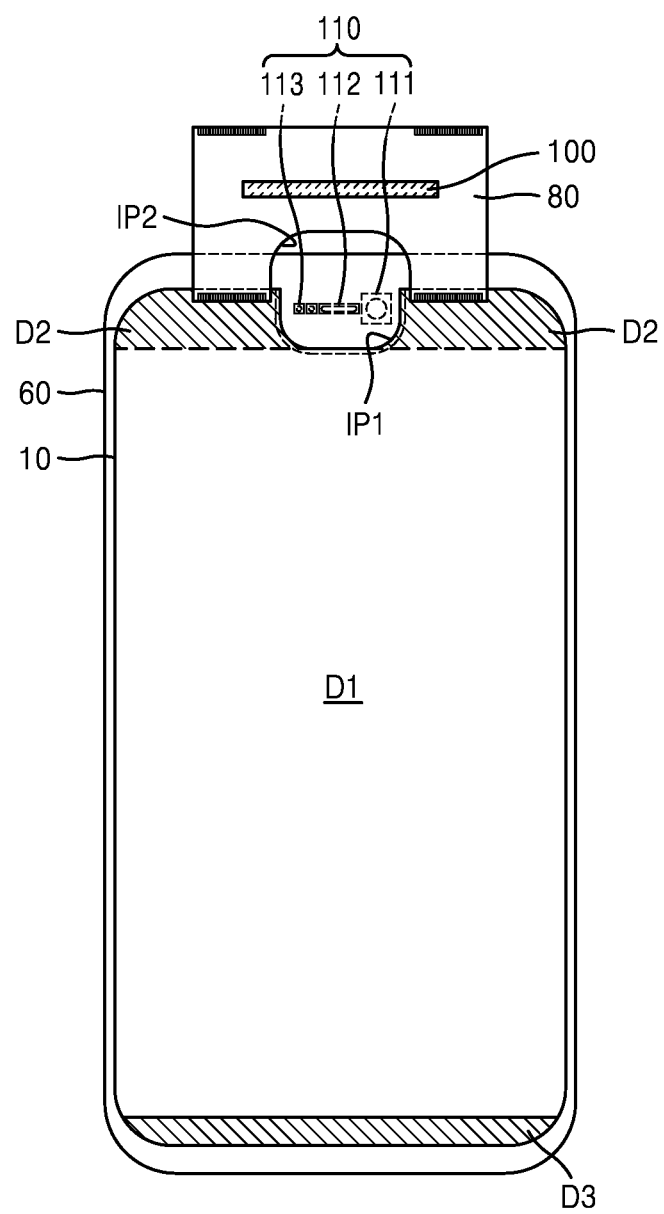

FIGS. 5A, 5B, and 5C are plan views of comparing a display area of a display apparatus according to the present exemplary embodiment with a display area of a display apparatus according to a comparative example.

FIG. 5A is a display apparatus according to a first comparative example. The display apparatus of FIG. 5A includes a component 110 capable of expanding functions of a display apparatus such as the camera module 111, the speaker 112, and the sensor 113 above the substrate 10, and further includes the wiring film 80 in which the integrated circuit chip 100 is mounted below the substrate 10.

A schematic display area of the display apparatus according to the first comparative example is a first area D1 excluding upper and lower ends of the substrate 10.

The first area D1 is strictly an area of the display unit 20 under transparent substrate 60 formed slightly inward from the substrate 10, but is used for explaining a schematic difference of the display area. Therefore, the drawing showing the substrate 10 is substituted for the description for the sake of convenience.

FIG. 5B is a display apparatus according to a second comparative example. The display apparatus of FIG. 5B includes the first indented portion IP1 above the substrate 10, and further includes the component 110 capable of expanding functions of a display apparatus such as the camera module 111, the speaker 112, and the sensor 113 in a space where the substrate 10 is cut. Further, the wiring film 80 including the integrated circuit chip 100 is below the substrate 10.

A schematic display area of the display apparatus of the second comparative example is a sum of the first area D1 and the second area D2 where the first indented portion IP1 is not formed above the substrate 10. Therefore, the display apparatus of the second comparative example has a display area that is greater than that of the display apparatus of the first comparative example.

FIG. 5C is a display apparatus according to the present exemplary embodiment. The display apparatus of FIG. 5C includes the first indented portion IP1 above the substrate 10, and further includes the component 110 capable of expanding functions of a display apparatus such as the camera module 111, the speaker 112, and the sensor 113 in a space where the substrate 10 is cut. Further, the wiring film 80 including the second indented portion IP2 and the integrated circuit chip 100 are above the substrate 10.

Therefore, a schematic display area of the display apparatus is a sum of the first area D1, the second area D2 where the first indented portion IP1 is not formed above the substrate 10, and a third area D3 extending from a lower end of the substrate 10. Therefore, the display apparatus of the present exemplary embodiment has a display area that is greater than those of the display apparatuses of the first comparative example and the second comparative example.

Accordingly, the display apparatus of the present exemplary embodiment may provide the display apparatus 1 having an enlarged display area to mount various components while a large screen is maintained.

Meanwhile, a polarizer film 40 may be further arranged above the encapsulating unit 30.

The polarizer film 40 may be a circular polarizer film produced by bonding a plurality of linear polarizer films and a phase difference film.

Although FIG. 3 shows that an end of the polarizer film 40 is more inward than an end of the substrate 10 in the first indented portion IP1, the inventive concepts are not limited thereto. The end of the polarizer film 40 may coincide with or protrude from the end of the substrate 10 in the first indented portion IP1.

A transparent substrate 60 may be above the polarizer film 40 and an adhesive layer 50 may be between the polarizer film 40 and the transparent substrate 60.

The transparent substrate 60 may be formed of a transparent material. The transparent substrate 60 is arranged to cover not only the display unit 20 but also an area where the component 110 is arranged. The transparent substrate 60 may be a touch screen panel that performs a touch screen function for the display unit 20.

In the present exemplary embodiment, the polarizer film 40 may be formed on the encapsulating unit 30 after a cutting process for the first indented portion IP1. The polarizer film 40 may be previously cut to reflect a shape of the first indented portion IP1 to some extent, and then arranged above the encapsulating unit 30.

In the present exemplary embodiment, the adhesive layer 50 may be formed on the polarizer film 40 after the cutting process for the first indented portion IP1. The adhesive layer 50 may be previously cut or applied to reflect a shape of the first indented portion IP1 to some extent, and then arranged above the polarizer film 40. Furthermore, the adhesive layer 50 may be first applied to the transparent substrate 60 to be described later below and then arranged above the polarizer film 40 together with the transparent substrate 60.

Figure 6:
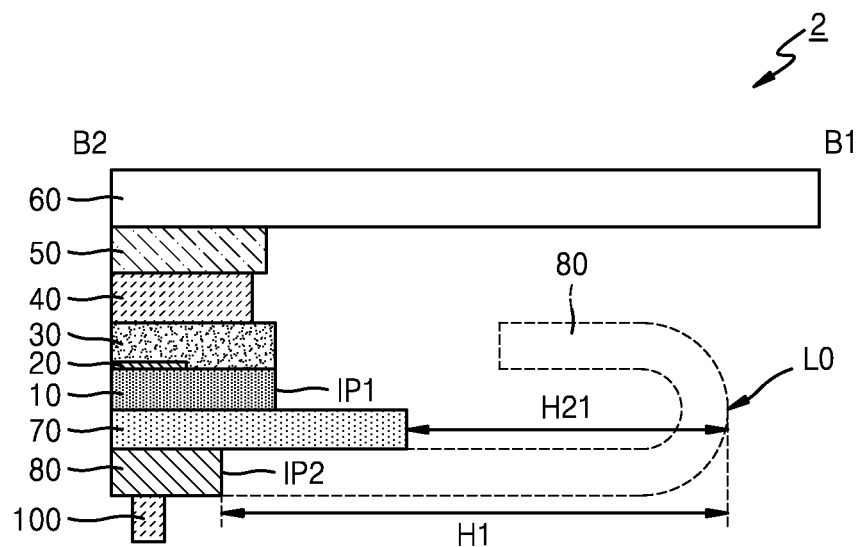
FIG. 6 is a cross-sectional view of a portion of a display apparatus according to another exemplary embodiment.

FIG. 6 is a cross-sectional view of a portion of a display apparatus 2 according to another exemplary embodiment. A difference from the display apparatus 1 of the present exemplary embodiment in FIG. 3 will be mainly described.

Referring to FIG. 6, an end of the cover panel 70 protrudes further toward the outside of the display apparatus 2 than the end of the substrate 10. Furthermore, a shape of the end of the cover panel 70 needs not be substantially the same as a shape of the first indented portion IP1. Since the end of the cover panel 70 protrudes further toward the outside of the display apparatus 2 than the end of the substrate 10, the cover panel 70 stably supports the substrate 10 while bonding the wiring film 80 to the substrate 10.

In the present exemplary embodiment, the maximum depth H1 from the edge L0 of an area where the wiring film 80 is bent to the second indented portion IP2 is formed to be not less than a maximum depth H21 from the edge L0 of the area where the wiring film 80 is bent to the end of the cover panel 70. The components 110 (of FIG. 1A) may be in a space between the edge L0 of the area where the wiring film 80 is bent and the end of the cover panel 70.

Figure 7:
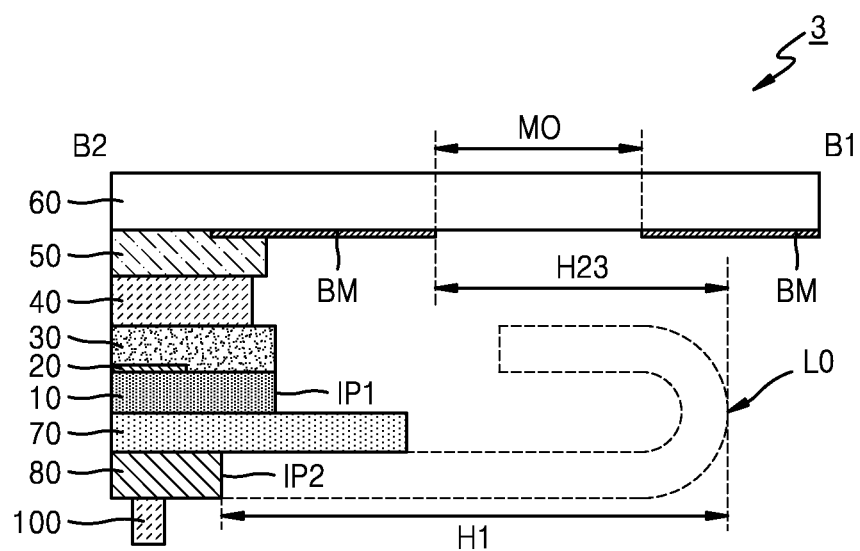
FIG. 7 is a cross-sectional view of a portion of a display apparatus according to another exemplary embodiment.

FIG. 7 is a cross-sectional view of a portion of a display apparatus 3 according to another exemplary embodiment. A difference from the display apparatus 2 of the present exemplary embodiment in FIG. 6 will be mainly described.

Referring to FIG. 7, a black matrix BM is further arranged above a surface of a transparent substrate facing the display unit 20. The black matrix BM is at an outer edge of the display unit 20 and a module opening MO is formed in an area where the components 110 (of FIG. 1A) are to be arranged. Light leakage through the area where the components 110 (of FIG. 1A) are arranged may be reduced or prevented by forming the black matrix BM.

The maximum depth H1 from the edge L0 of the area where the wiring film 80 is bent to the second indented portion IP2 is formed to be not less than a maximum depth H23 from the edge L0 of the area where the wiring film 80 is bent to a point closest to a display unit 20 of the black matrix BM and the module opening MO. The components 110 (of FIG. 1A) may be arranged in a space formed by the module opening MO.

The cover panel 70 may be freely designed in a range that does not overlap the module opening MO.

Although not shown in FIG. 7, a second opening (not shown) may be further formed in the transparent substrate 60 in an area corresponding to the module opening MO. Unlike the camera module 111 and the sensor 113, the component 110, such as the speaker 112, needs to form a second opening (not shown) in the transparent substrate 60 for sound transmission.

FIGS. 8A, 8B, 8C, 8D, and 8E are plan views of various shapes of the first and second pad units 11 and 12 and the third and fourth pad units 81 and 82 of the inventive concepts.

Figure 8A:
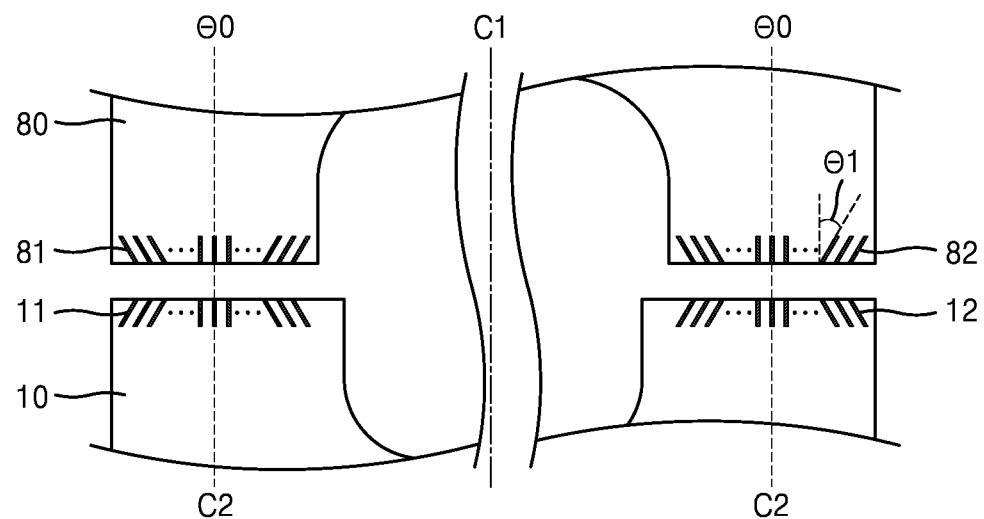
FIGS. 8A, 8B, 8C, 8D, and 8E are plan views showing an exemplary embodiment in which an inclination of wirings of first and second pad units and third and fourth pad units increases as a distance of the wirings from a center increases.

Referring to FIG. 8A, wirings of the first pad unit 11 of the substrate 10 and the third pad unit 81 of the wiring film 80 are arranged symmetrically with respect to respective center lines C2. Wirings of the second pad unit 12 of the substrate 10 and the fourth pad unit 82 of the wiring film 80 are arranged symmetrically with respect to the respective center lines C2. Wirings near a center line C2 have an inclination θ0 of zero degrees with respect to the center line C2, and the wirings spaced apart from the center line C2 are inclined obliquely from the center line C2 to have a predetermined inclination θ1 greater than zero degrees.

When the substrate 10 and the wiring film 80 are aligned and bonded to each other, a conductive bonding layer such as an anisotropic conductive film (not shown) is between the first pad unit 11 of the substrate 10 and the third pad unit 81 of the wiring film 80 and between the second pad unit 12 of the substrate 10 and the fourth pad unit 82 of the wiring film 80, wherein the substrate 10 and the wiring film 80 are physically and firmly bonded and is electrically connected to each other by pressing.

Figure 8B:
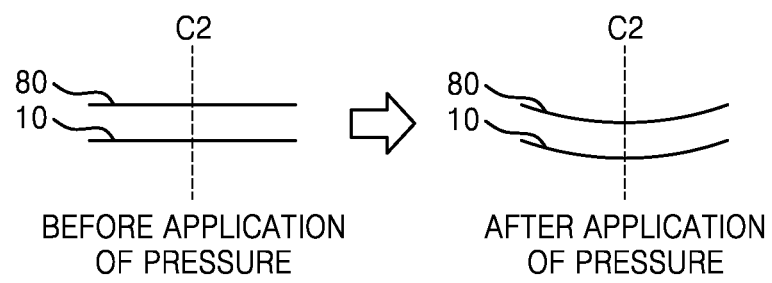

As shown in FIG. 8B, the substrate 10 and the wiring film 80 may be bent around the center line C2 when pressure is applied to the center line C2 at the time of bonding and the anisotropic conductive film may not be aligned in a straight line due to such curvature and pressure, resulting in disconnection with pad wirings.

In the present exemplary embodiment, wirings are arranged symmetrically with respect to the center lines C2 of the first pad unit 11 and the third pad unit 81, and the second pad unit 12 and the fourth pad unit 82, and the wirings spaced apart from the center line C2 are inclined obliquely from the center line C2 to have a constant inclination θ1 with respect to the center line C2, so that disconnection between the anisotropic conductive film and the pad wirings may be prevented.

Figure 8C:
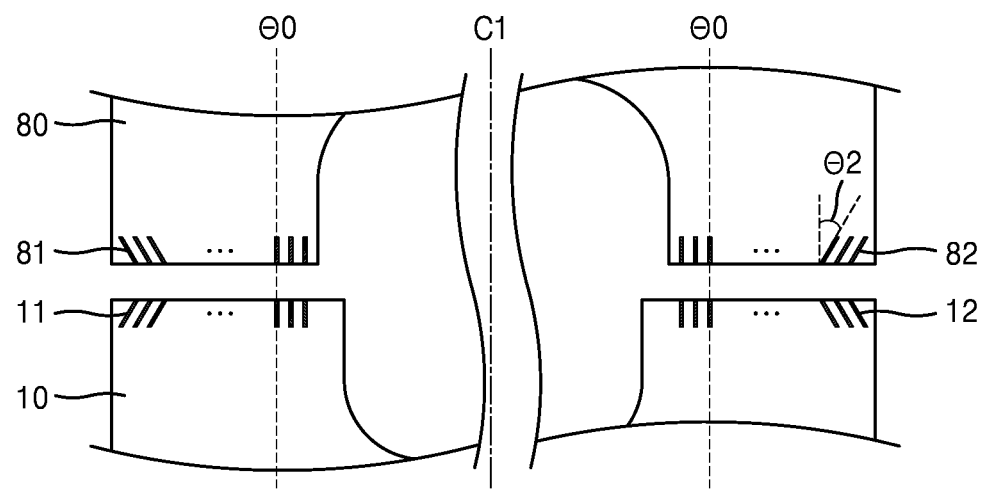

FIG. 8C shows an exemplary embodiment in which the respective wirings of the first to fourth pad units 11, 12, 81, and 82 of the substrate 10 and the wiring film 80 are arranged symmetrically with respect to a virtual center line C1, and the wirings spaced apart from the center line C1 are inclined obliquely from the center line C1 and formed at a predetermined inclination θ2 greater than zero degrees.

According to the present exemplary embodiment, disconnection between an anisotropic conductive film and pad wirings, which may occur when pressure is applied to the center line C1 when the anisotropic conductive film is pressed, may be prevented.

Figure 8D:
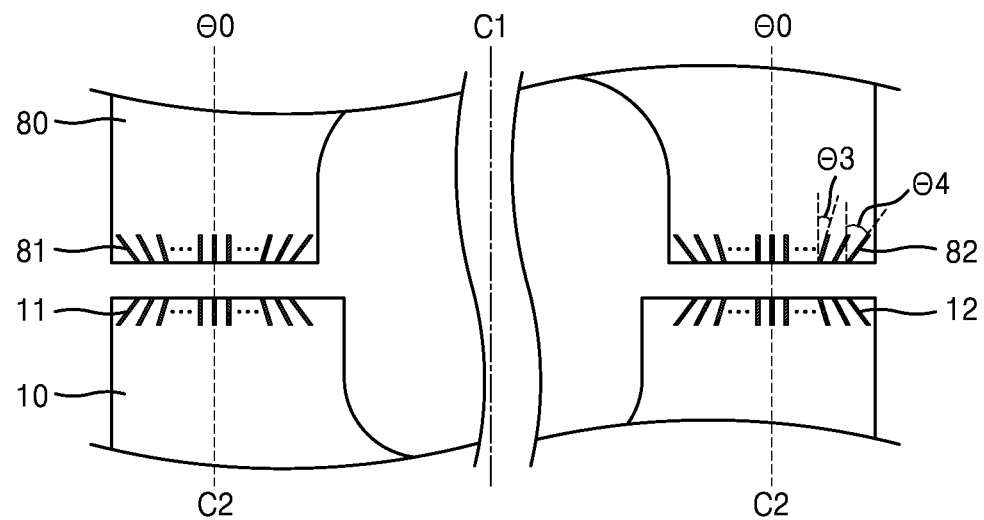

Referring to FIG. 8D, the wirings of the first pad unit 11 of the substrate 10 and the third pad unit 81 of the wiring film 80 are arranged symmetrically with respect to respective center lines C2. The wirings of the second pad unit 12 of the substrate 10 and the fourth pad unit 82 of the wiring film 80 are arranged symmetrically with respect to the respective center lines C2. The wirings near the center line C2 have an inclination θ0 of zero degrees with respect to the center line C2, and the wirings spaced apart from the center line C2 are inclined obliquely from the center line C2 so that the inclination increases as the distance from the center line C2 increases (θ3<θ4). Similar to the exemplary embodiment of FIG. 8A, disconnection between an anisotropic conductive film and pad wirings, which may occur when bonding is performed under pressure on the center line C2, may be prevented.

Figure 8E:
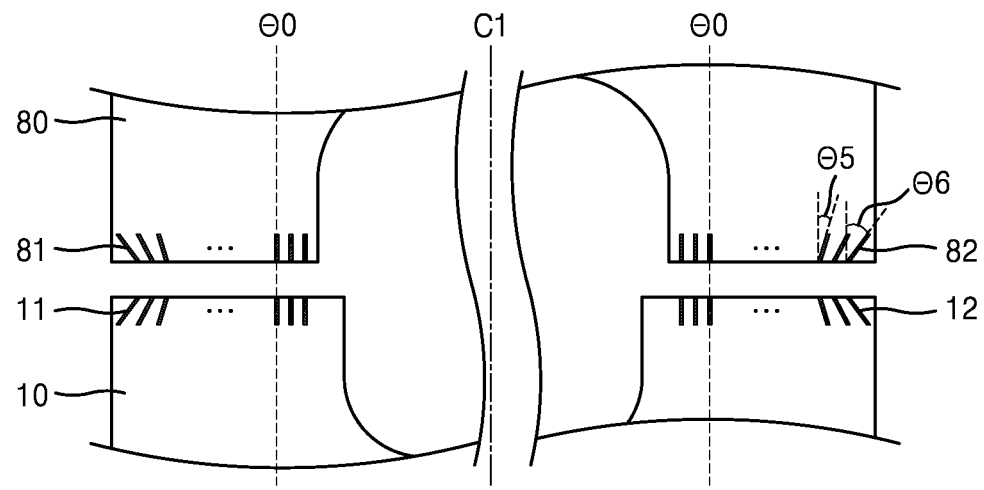

In FIG. 8E, the wirings of the pad units 11, 12, 81 and 82 in the substrate 10 and the wiring film 80 are arranged symmetrically with respect to the virtual center line C1, and the wirings spaced apart from the center line C1 are inclined obliquely from the center line C1 so that the inclination increases as the distance from the center line C1 increases (θ5<θ6). Similar to the exemplary embodiment of FIG. 8C, disconnection between an anisotropic conductive film and pad wirings, which may occur when bonding is performed under pressure on the center line C1, may be prevented.

Figure 9:
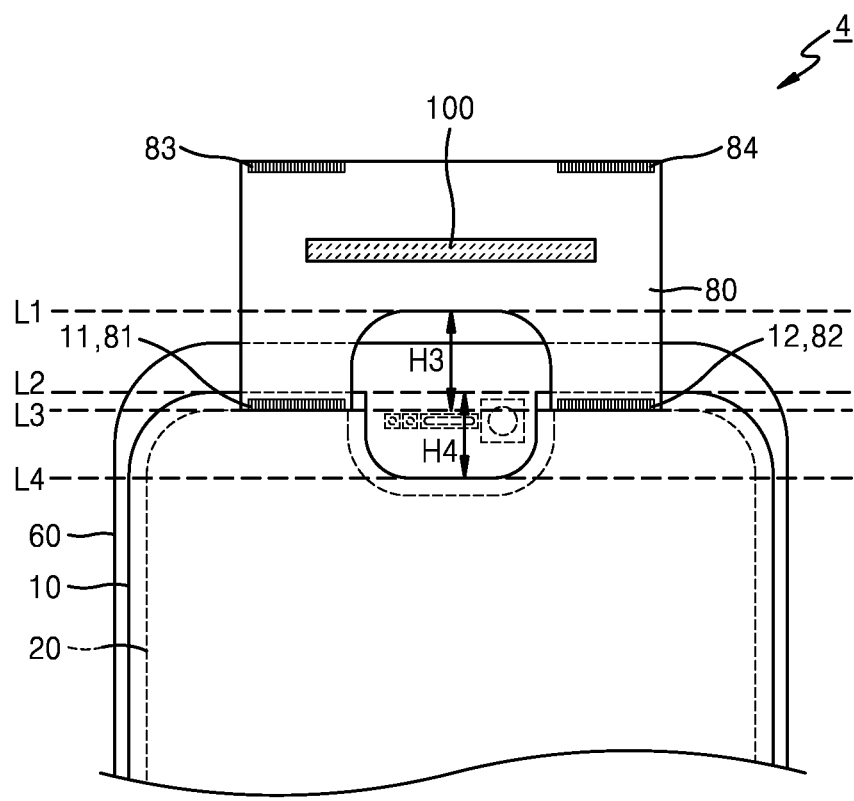
FIG. 9 is a cross-sectional view of a portion of a display apparatus according to another exemplary embodiment.

FIG. 9 is a cross-sectional view of a portion of a display apparatus 4 according to another exemplary embodiment. A difference from the display apparatus 1 of the present exemplary embodiment in FIG. 1B will be mainly described.

In the present exemplary embodiment, a maximum depth H3 from an end L3 of the third pad unit 81 and the fourth pad unit 82 of the wiring film 80 to an end L1 of the second indented portion IP2 formed in the wiring film 80 may be formed to be not less than a maximum depth H4 from an end L2 of the substrate 10 to an end L4 of the first indented portion IP1 formed in the substrate 10.

Figure 10:
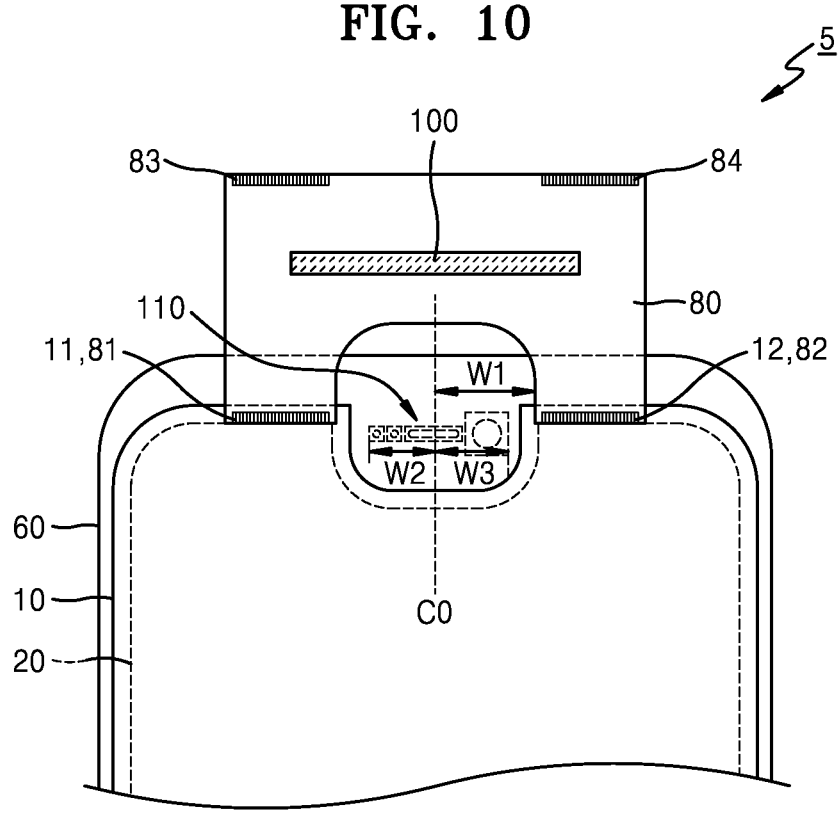
FIG. 10 is a cross-sectional view of a portion of a display apparatus according to another exemplary embodiment.

FIG. 10 is a cross-sectional view of a portion of a display apparatus 5 according to another exemplary embodiment. A difference from the display apparatus 1 of the present exemplary embodiment in FIG. 1B will be mainly described.

In the present exemplary embodiment, a maximum width W1 from a central axis C0 to the second indented portion IP2 of the wiring film 80 may be formed to be not less than a maximum value of a maximum width W2 from a central axis C0 to the component 110 at a leftmost side and a maximum width W3 from a central axis C0 to the component 110 at a rightmost side.

Figure 11:
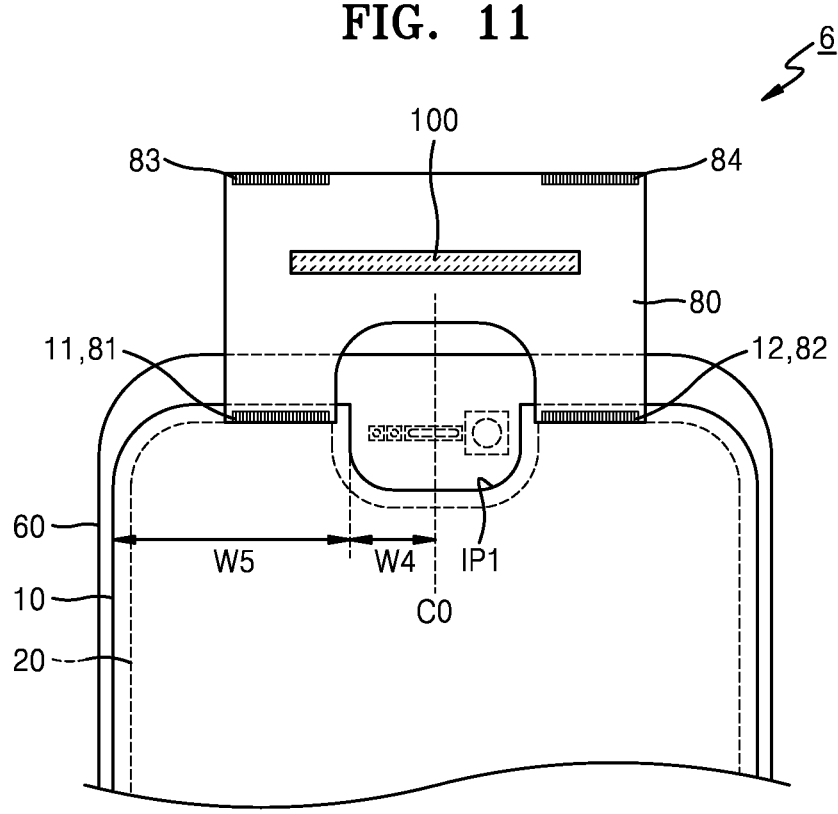
FIG. 11 is a cross-sectional view of a portion of a display apparatus according to another exemplary embodiment.

FIG. 11 is a cross-sectional view of a portion of a display apparatus 6 according to another exemplary embodiment. A difference from the display apparatus 1 of the present exemplary embodiment in FIG. 1B will be mainly described.

In the present exemplary embodiment, a maximum width W5 from one end of the first indented portion IP1 formed in the substrate 10 to an edge of the substrate 10 may be formed to be not less than a maximum width W4 from one end of the first indented portion IP1 to the central axis C0, so that a pad unit forming space may be provided.

Figure 12:
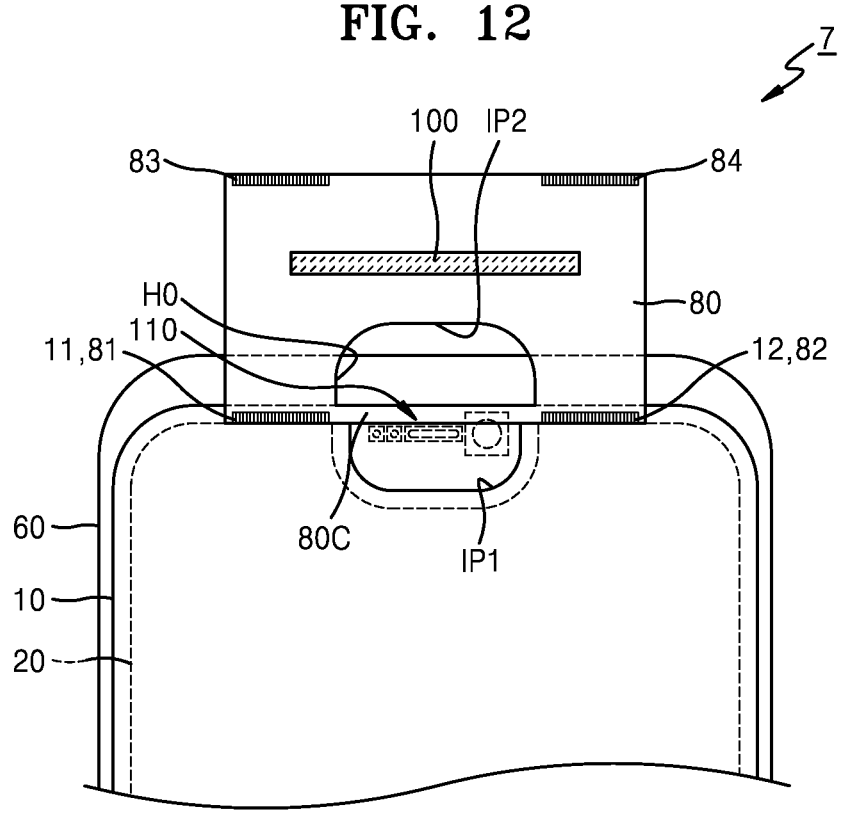
FIG. 12 is a cross-sectional view of a portion of a display apparatus according to another exemplary embodiment.

FIG. 12 is a cross-sectional view of a portion of a display apparatus 7 according to another exemplary embodiment. A difference from the display apparatus 1 of the present exemplary embodiment in FIG. 1B will be mainly described.

In the present exemplary embodiment, the wiring film 80 is further provided with a dummy pad unit 80C between the third pad unit 81 and the fourth pad unit 82. The dummy pad unit 80C and the second indented portion IP2 of the wiring film 80 may form a through hole H0 and the components 110 may be arranged in a space corresponding to the through hole H0. The dummy pad unit 80C contacts the substrate 10 between the first pad unit 11 and the second pad unit 12 of the substrate 10 so that adhesive strength between the substrate 10 and the wiring film 80 may be improved.

Figure 13:
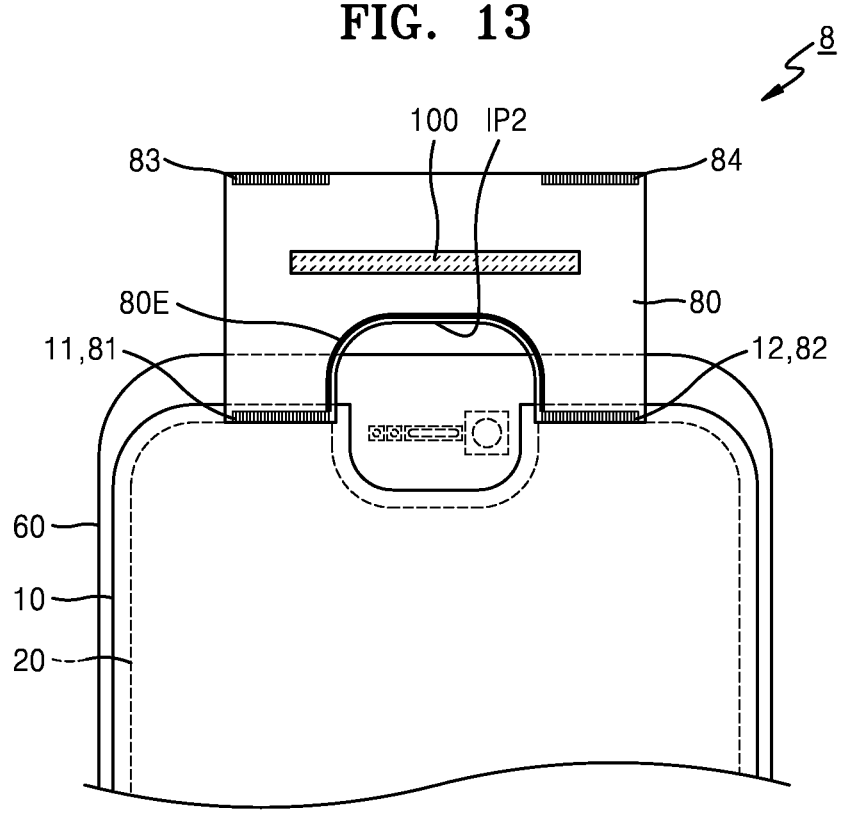
FIG. 13 is a cross-sectional view of a portion of a display apparatus according to another exemplary embodiment.

FIG. 13 is a cross-sectional view of a portion of a display apparatus 8 according to another exemplary embodiment. A difference from the display apparatus 1 of the present exemplary embodiment in FIG. 1B will be mainly described.

In the present exemplary embodiment, the wiring film 80 further includes a ground portion 80E formed around the second indented portion IP2. The ground portion 80E may be formed of a conductive material. The ground portion 80E is formed to be grounded to the wiring film 80, so that static electricity of the wiring film 80 may be prevented and electrical noise may be blocked.

Figure 14:
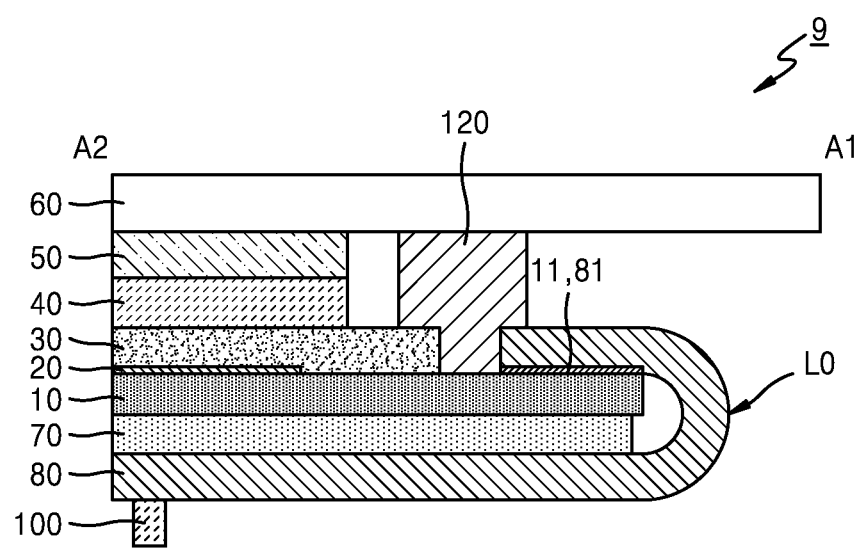
FIG. 14 is a cross-sectional view of a portion of a display apparatus according to another exemplary embodiment.

FIG. 14 is a cross-sectional view of a portion of a display apparatus 9 according to another exemplary embodiment. A difference from the display apparatus 1 of the present exemplary embodiment in FIG. 2 will be mainly described.

In the present exemplary embodiment, a filler 120 is further arranged between the substrate 10 and the transparent substrate 60. The filler 120 may disperse impact applied to the substrate 10 and the transparent substrate 60. The filler 120 is spaced apart from the adhesive layer 50 by a predetermined distance and is arranged so as to surround the display unit 20. It is possible to prevent a chemical reaction between the filler 120 and the adhesive layer 50 and to reduce or prevent the filler 120 from invading the display unit 20.

Figure 15:
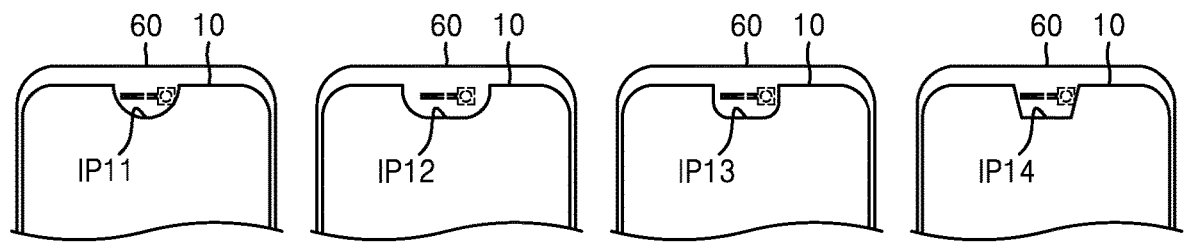
FIG. 15 is a view of various shapes of a first indented portion.

FIG. 15 is a view of various shapes of a first indented portion according to the present exemplary embodiment. FIG. 15 discloses a first indented portion IP11 in a semi-circular shape, a first indented portion IP12 in a semi-elliptical shape, a first indented portion IP13 in an arcuate shape, and a first indented portion IP14 in a trapezoidal shape. The shape of a first indented portion formed in the substrate 10 according to the inventive concepts are not limited to the shapes shown in FIG. 15.

Figure 16:
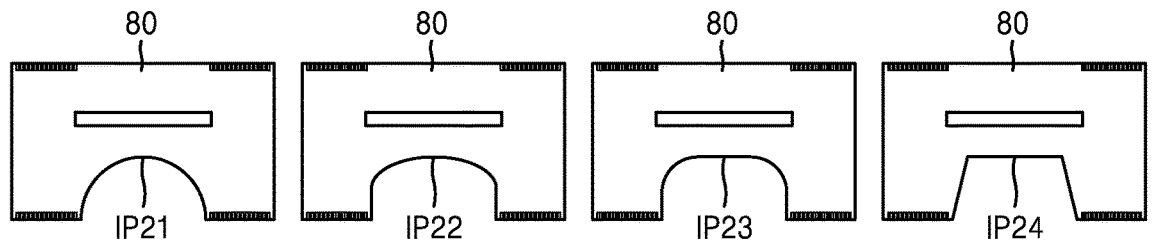
FIG. 16 is a view of various shapes of a second indented portion.

FIG. 16 is a view of various shapes of a second indented portion according to the present exemplary embodiment. FIG. 16 discloses a second indented portion IP21 in a semi-circular shape, a second indented portion IP22 in a semi-elliptical shape, a second indented portion IP23 in an arcuate shape, and a second indented portion IP24 in a trapezoidal shape. The shape of a second indented portion formed in the wiring film 80 according to the inventive concepts are not limited to the shapes shown in FIG. 16.

According to exemplary embodiments of the inventive concepts as described above, a display apparatus in which various components are mounted and a large screen can be implemented may be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate on which a first indented portion indented inward along one side of the substrate is formed;
   a first pad unit and a second pad unit spaced apart from each other on the substrate along the one side;
   a display unit above the substrate and having a shape indented inward between the first pad unit and the second pad unit;
   an encapsulating unit encapsulating the display unit; and
   a wiring film bent from a first surface of the substrate to a second surface of the substrate, the wiring film comprising a third pad unit and a fourth pad unit connected to the first pad unit and the second pad unit, respectively, and a second indented portion indented inward between the third pad unit and the fourth pad unit.

2. The display apparatus of claim 1, wherein the encapsulating unit comprises at least one inorganic layer and at least one organic layer.

3. The display apparatus of claim 1, wherein the encapsulating unit comprises at least one inorganic layer and at least one organic layer,
   an outermost layer of the encapsulating unit comprises an inorganic layer, and
   the inorganic layer, which is comprised in the outermost layer, is configured to cover a side surface of the at least one organic layer.

4. The display apparatus of claim 1, wherein the encapsulating unit comprises at least one inorganic layer and at least one organic layer,
   an outermost layer of the encapsulating unit comprises an inorganic layer, and
   the inorganic layer, which is comprised in the outermost layer, is configured to cover a side surface of the substrate in which the first indented portion is formed.

5. The display apparatus of claim 1, wherein a test dummy pixel is further arranged outside the display unit along the first indented portion.

6. The display apparatus of claim 1, wherein the wiring film further comprises an integrated circuit chip,
   wherein the integrated circuit chip is arranged so as not to overlap the display unit.

7. The display apparatus of claim 1, wherein the wiring film further comprises a ground portion grounded to the wiring film along the second indented portion.

8. The display apparatus of claim 1, wherein a transparent substrate is further arranged above the encapsulating unit.

9. The display apparatus of claim 8, wherein a black matrix is further arranged above the transparent substrate at a position corresponding to an outer edge of the display unit.

10. The display apparatus of claim 9, wherein the black matrix has a first opening at a position corresponding to the first indented portion.

11. The display apparatus of claim 10, wherein the transparent substrate has a second opening at a position corresponding to the first opening.

12. The display apparatus of claim 8, further comprising:
    a polarizer film between the encapsulating unit and the transparent substrate.

13. The display apparatus of claim 12, further comprising:
    an adhesive layer between the polarizer film and the transparent substrate.

14. The display apparatus of claim 8, further comprising:
    a filler between the substrate and the transparent substrate, the filler being spaced apart from an adhesive layer and surrounding an outer edge of the display unit.

15. The display apparatus of claim 1, further comprising:
    a cover panel on the second surface of the substrate, the cover panel comprising a cushioning material.

16. The display apparatus of claim 15, wherein an end of the cover panel coincides with an end of the substrate in the first indented portion.

17. The display apparatus of claim 15, wherein an end of the cover panel protrudes from an end of the substrate to an outside of the display unit in the first indented portion.

18. The display apparatus of claim 1, wherein the first pad unit and the second pad unit comprise a plurality of pad wirings,
    wherein the plurality of pad wirings are formed obliquely so as to be symmetrical to a center of the first indented portion.

19. The display apparatus of claim 1, wherein the third pad unit and the fourth pad unit comprise a plurality of pad wirings,
    wherein the plurality of pad wirings are formed obliquely so as to be symmetrical to a center of the second indented portion.

20. The display apparatus of claim 1, wherein a maximum depth from an edge of an area where the wiring film is bent to the second indented portion is not less than a maximum depth from an edge of the area where the wiring film is bent to the first indented portion.

21. The display apparatus of claim 1, a maximum depth from an end of the third pad unit and the fourth pad unit of the wiring film to the second indented portion is not less than a maximum depth from an end of the substrate to the first indented portion.

22. A display apparatus comprising:
    a substrate on which a first indented portion is indented inward along one side of the substrate;
    a first pad unit and a second pad unit spaced apart from each other on the substrate along the one side;
    a display unit above the substrate and having a shape indented inward between the first pad unit and the second pad unit;
    an encapsulating unit encapsulating the display unit; and
    a wiring film bent from a first surface of the substrate to a second surface of the substrate, the wiring film comprising a third pad unit and a fourth pad unit connected to the first pad unit and the second pad unit, respectively, a dummy pad unit configured to connect the third pad unit and the fourth pad unit, and a through hole formed inward along the one side of the substrate.

* * * * *